United States Patent [19]
Damarla et al.

[11] Patent Number: 5,974,242
[45] Date of Patent: Oct. 26, 1999

[54] METHODS AND COMPUTER PROGRAMS FOR MINIMIZING LOGIC CIRCUIT DESIGN USING IDENTITY CELLS

[75] Inventors: T. Raju Damarla, Burtonsville, Md.; Wei Su, Staten Island, N.Y.

[73] Assignee: The United States of America as represented by the Secretary of the Army, Washington, D.C.

[21] Appl. No.: 08/937,960

[22] Filed: Sep. 25, 1997

[51] Int. Cl.[6] .................................................. G06F 17/50
[52] U.S. Cl. .............................. 395/500.03; 395/500.04
[58] Field of Search .................................. 364/488–491, 364/578; 395/500.02–500.19

[56] References Cited

U.S. PATENT DOCUMENTS

| | | | |
|---|---|---|---|
| 4,792,909 | 12/1988 | Serlet ....................................... | 364/491 |
| 5,243,538 | 9/1993 | Okuzawa et al. ....................... | 364/489 |
| 5,522,063 | 5/1996 | Ashar et al. ............................ | 395/500 |
| 5,524,082 | 6/1996 | Horstmann et al. .................... | 364/489 |
| 5,594,656 | 1/1997 | Tamisier ................................. | 364/488 |
| 5,708,594 | 1/1998 | Iwashita et al. ........................ | 364/578 |
| 5,734,798 | 3/1998 | Allred ..................................... | 395/50 |
| 5,754,454 | 5/1998 | Pixley et al. ............................ | 364/580 |
| 5,805,462 | 9/1998 | Poirot et al. ............................ | 364/490 |

OTHER PUBLICATIONS

Nishitani et al., "Lower bounds on size of periodic functions in exclusive–OR sum–of–products expressions", IEICE Trans. Fundamentals, vol. E77–A, No. 3, pp. 475–582, Mar. 1994.

Johnson, E.L. et al., "Digital Design: A Pragmatic Approach", PWS Engineering, Boston, Massachusetts, pp. 39–48, Jan. 1987.

Damarla, T. and Karpovsky, M., "Fault Detection in Combinational Networks by Reed–Muller Transforms", IEEE Trans. Computers, vol. 38, No. 6, Jun. 1989, pp. 788–797.

Bryant, Randal E., "Graph–Based Algorithms for Boolean Function Manipulation", IEEE Trans. Computers, vol. C–35, No. 8, Aug. 1986, pp. 677–691.

*Primary Examiner*—Kevin Teska
*Assistant Examiner*—Phallaka Kik
*Attorney, Agent, or Firm*—Michael Zelenka; George B. Tereschuk

[57] ABSTRACT

Methods and computer programs for logic circuit design minimization with Identity cell representation is provided which can simplify logic circuit design by combining and minimizing Identity cells and thereby reducing the number of gates in the logic circuit. All possible Identity cells from a given logic function are generated by combining every possible pair of logic terms, then equivalent Identity cell terms are eliminated and the best subset of Identity cell terms which covers all the minterms of the given logic function is provided.

The I-cell term representation is sufficiently broad in its scope to allow representation of sub-functions such as ABC+$\overline{ABC}$ as a single entity that can be readily used for minimization which may be advantageously used in logic circuit fabrication and design. Since I-cell representation includes sum of products, EXOR, EXNOR and other logic terms, fewer terms will be needed to represent a given Boolean function, and a much more simplified, inexpensive and advantageous optimal logic design structure will be obtained.

24 Claims, 3 Drawing Sheets

METHODS AND COMPUTER PROGRAMS FOR MINIMIZING LOGIC CIRCUIT DESIGN USING IDENTITY CELLS

GOVERNMENT INTEREST

The invention described herein may be manufactured, used and licensed by or for the Government of the United States of America without the payment to us of any royalties thereon.

FIELD OF THE INVENTION

The present invention pertains to the field of logic circuits. More particularly, the present invention relates to the minimization of logic circuit gates and designs.

BACKGROUND OF THE INVENTION

Currently there are no efficient methods to represent logic circuit design with Exclusive-OR, (EXOR) terms, Exclusive-NOR (EXNOR) terms, terms with embedded functions, such as $f(ABC)=ABC+\overline{ABC}$, and hence there are no efficient techniques available that would extract common terms, or partial functions, and minimize them. One of the reasons for this is that the existing minimization techniques are geared towards extracting prime implicants, also known as AND terms, rather than extracting partial functions, such as $ABC+\overline{ABC}$ and so on, which would result in achieving better minimization algorithms. The existing minimization algorithms can be divided into two broad categories, namely, those that generate either a sum of products (SOP), or a product of sums (POS), and those that generate EXOR sum of products (ESOP). Therefore, logic circuit designs are restricted to NAND-NAND or NOR-NOR or AND-EXOR structures, even though a better structure could be obtained by using OR, AND, EXOR, EXNOR gates, and other logic structures. Recent PLA, PLD, and FPGA architectures have included explicit EXOR gates which are often left unused when the minimization CAD tools cannot effectively extract the EXOR/EXNOR functions. FPGA's allow us to implement Boolean functions efficiently if they can be represented properly and minimized efficiently by extracting partial functions.

Another problem in the traditional minimization technique is they cannot effectively extract complementary functions in the minimization process. For example, consider a function $f(ABCD)$ that can be represented as:

$$Ag(BC)\overline{D}+A\overline{g}(BC)D$$

where $g(BC)=\overline{B}C+B\overline{C}$ and $\overline{g}=BC+\overline{BC}$. If we can extract $\overline{B}C+B\overline{C}$ and $BC+\overline{BC}$ as complements of each other, then $f(ABCD)$ can be represented more simply as:

$$A(g\overline{D}+\overline{g}D)=A(g\oplus D)$$

The reason is that most minimization techniques try to eliminate one variable at a time, such as $ABC+AB\overline{C}=AB$, rather than considering several variables at a time, namely, $ABC+\overline{ABC}$. Since the single variable minimization methods use bit manipulation techniques, where each variable is represented by a bit, they do not produce efficient results. For example, the logic function:

$$f(ABCDE)=ABCDE+A\overline{BCDE}+Afheight\overline{BCDE}+A\overline{B}CDE+A\overline{BCDE}+\overline{ABCDE}$$

can be reduced to a very simple structure, $A(\overline{B\oplus g})$, where $g=CDE+\overline{CDE}$. Unfortunately, prior art minimization methods cannot extract functions like g and still provide the above minimal representation for $f(ABCDE)$. Graph based methods, such as Binary Decision Diagrams (BDD), for Boolean function manipulation try to overcome some of the above problems, however the effectiveness of the result depends on the ordering of the variables.

Due to the shortcomings, drawbacks and limitations of prior art minimization procedures, there has been a long-felt need for new minimization techniques which successfully extract EXOR functions embedded within Boolean expressions. Comparison of new minimization techniques provided by the present invention with traditional SOP minimization CAD tools such as Espresso and McBoole demonstrate that more efficient circuits in terms of the number of logic gates and in terms of size, where the number of gate inputs gives a more accurate size comparison as related to ASIC implementations, can be achieved. A minimization technique in accordance with the present invention that successfully extracts EXOR functions can be very useful in the synthesis of VLSI systems, Built-In Self-Test (BIST) approaches in ASICs, and in the mapping of Boolean expressions into input-limited PLD macrocells and FPGA Look-up Tables while making use of EXOR gates available in the programmable logic blocks but residing external to the macrocells or Look-up Tables themselves, and in minimizing ISCAS85 benchmark circuits for the evaluation of the actual savings in the number of gates. The present invention answers the long-felt need for this capability by providing an identity cell representation that allows the representing of sub-functions as a single entity that can be readily used for minimization in logic circuit design and fabrication.

Prior art approaches, methods and techniques are described in the following publications: Johnson, E. L., et. al "Digital Design: A Pragmatic Approach," PWS Engineering, Boston, Mass., 19**, pp. 39–48;

Damarla, T. and Karpovsky, M., "Fault Detection in Combinational Networks by Reed Muller Transforms," IEEE Trans. Computers, Vol. 38, No. 6, June 1989, pp. 788–797; and Bryant R. E., "Graph Based Algorithms for Boolean Function Manipulation," IEEE Trans. Computers, Vol C-35, No. 8, August 1986, pp. 509–516.

SUMMARY OF THE INVENTION

The present invention provides a novel approach for logic circuit design minimization which does not suffer from any of the shortcomings, drawbacks and limitations of prior art techniques. First, a new representation for the sum of two terms is introduced for performing traditional Boolean minimization, for example $AB+A\overline{B}=A$, as well as terms of the type $ABCD+\overline{ABCD}$. These terms are identified as Identity cell (I-cell) terms in accordance with the methods and articles of manufacture of the present invention. The I-cell term representation is sufficiently broad in its scope to allow representation of sub-functions such as $ABC+\overline{ABC}$ as a single entity that can be readily used for minimization which may be advantageously used in logic circuit fabrication and design.

The new minimization process of the present invention can simplify logic circuit design by combining and minimizing I-cells. Since I-cell representation includes sum of products, EXOR, EXNOR and other logic terms, fewer terms will be needed to represent a given Boolean function, and a much more simplified, inexpensive and advantageous optimal logic design structure will be obtained. Useful properties of I-cells are also disclosed. The generation and selection of I-cells is extremely useful in minimization process because they result in minimal representation of a logic circuit and hence result in implementing the logic circuit with the minimum number of gates. Some minimization results are obtained by using the minimization computer program disclosed and claimed in the present invention. Comparing the minimization results achieved by prior art techniques with results achieved using the methods and computer programs of the present invention indicates an improvement of between 10 to 20% minimization.

It is an object of the present invention to provide methods of minimizing logic circuit design by employing I-cells, without the drawbacks, limitations and shortcomings of prior art minimization techniques.

It is also an object of the present invention to provide an article of manufacture in the form of a computer program to minimize logic circuit design by employing I-cells, without the drawbacks, limitations and shortcomings of prior art minimization techniques. While the specific computer program developed by the inventors herein was written in Perl computer language which uses the concepts of I-cell and their properties, however those skilled in the logic circuit design arts will readily realize that other computer languages may be advantageously employed in accordance with this invention such as C, C ++, FORTRAN and Ada. The use of such other languages is considered to be within the scope and contemplation of the present invention.

The term "identity cell," or "I-cell" as used throughout this specification should be considered to refer to any special combination of logic elements as another basic hardware unit in logic design circuits similar to AND, OR, EXOR, NAND and NOR gates, along with any other conventional and accepted definitions of those terms.

Table I lists I-cell terms generated by the operation of the computer program of the present invention.

Table II is a comparison of minimization results.

DETAILED DESCRIPTION OF THE PRESENT INVENTION

Figures 1, 2:
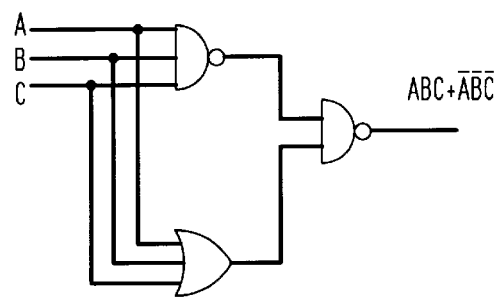
FIG. 1 is a diagram depicting an implementation of an I-cell term <A,B,C>.
FIG. 2 is a hardware design of a logic circuit described by a Karnaugh-Map indicating a Boolean function.

The methods and articles of manufacture of the present invention are primarily based on the concept of I-cell logic representation and properties. An Identity-cell (I-cell) is any special combination of logic elements used in logic circuit design as another basic hardware unit in those circuits like the AND, OR, EXOR, NAND and NOR gates. FIG. 1 illustrates the hardware implementation of a three input I-cell. Referring now to FIG. 1, there is depicted an implementation of an I-cell term $<ABC>=ABC+\overline{ABC}$. Symbolically, if $x_1, x_2, \ldots, x_n$ are input signals, we define:

$$<x_1, x_2, \ldots, x_n> = x_1 x_2 \ldots x_n + \overline{x_1} \overline{x_2} \ldots \overline{x_n}$$

as an n-input I-cell term. Where the term "<>" is an I-cell operator. More generally, in the case when $y_1\ y_2\ \ldots\ y_m < x_{m+1}, \ldots, x_n>$, where m is a integer and $y_i \in \{x_1, \ldots, X_m\}$, which is also defined as an I-cell term. Thus, an EXOR operation can by represented by a two input I-cell since $A \oplus B = \overline{A}B + A\overline{B} = \overline{<A,B>}$ or $<\overline{A}, B>$ and also as an EXNOR operation. Moreover, an I-cell can be used for simplification of two product terms, namely:

$$AB + A\bar{B} = A<B> = A$$

and for EXOR or EXNOR terms, such as:

$$AB + \overline{AB} = <A,B> = \overline{<\bar{A},B>}$$

$$\bar{A}B + A\bar{B} = <\bar{A},B> = <A,\bar{B}>$$

Thus an I-cell representation is more general than the conventional representation of a "sum of products" and is much more amenable to logic minimization, so that a logic circuit designed according to the present invention will be simpler than those using conventional methods. In accordance with the present invention, I-cells exhibit a number of hitherto unavailable useful and advantageous properties for logic circuit design.

The first noteworthy property of I-cell representation is that any two product terms with some variables in common while the remaining terms appear in complement form in one product term and in true form in the other can be combined into a single term with the operator <> function around the variables that are 1's complement of one another. For example, consider the terms $ABCDE + A\overline{B}C\overline{D}E$, where variables A, B and C are common to product term, while the variables B and D appear in one form in the first term and their complements appear in the second. Thus:

$$ABCDE + A\bar{B}C\bar{D}E = ACE<B,D>$$

This is significant because I-cell representation extracts subfunctions and their complements for minimization. Another example of this property is product terms with I-cell representation, such as:

$$<A,B><C,D> + \overline{<A,B>}\ \overline{<C,D>} = <<A,B>,<C,D>>$$

because $<A,B>$ and $<C,D>$ are complements of $\overline{<A,B>}$ and $\overline{<C,D>}$, respectively.

The second significant property of I-cell representation in accordance with the present invention is the capability to complement I-cell two inputs, as follows:

$$\overline{<A,B>} = <\bar{A},B>$$

$$\overline{<\bar{A},B>} = <\bar{A}B> = <A,\bar{B}>$$

The proof of this expression is a direct application of the first property that surrounds the variables with the operator function <>.

The third useful property of I-cell representation in logic circuit design is the ability to complement three I-cell inputs, in the following manner:

$$\overline{<A,B,\bar{C}>} = <A,B,C>$$

$$\overline{<A,B,C>} = <\bar{A},B> + <A,B,\bar{C}>$$

Similar to the second property, the proof of this expression is a straight forward application of the first property that surrounds the variables with the operator function <>.

For example, with I-cell representation the designer achieves the complementing ability to combine two terms of the type $D<A,B,\bar{C}>$ and $D<\bar{A},B>$ into the single term D $\overline{<A,B,C>}$, which can be further combined with $\bar{D}<A,B,C>$ to give the result of $<\bar{D}<A,B,C>>$.

The fourth significant characteristic of I-cell representation in accordance with the present invention is its commutative property, demonstrated by the following expression:

$$<A,B> = <B,A>$$

this commutative property is true by definition of the I-cell because $<A,B> = AB + \overline{AB} = <\overline{A},\overline{B}>$, and it can be extended to n-input variables. One example of the usefulness of this commutative law is that it allows extending the second and third properties of I-cell representation, to many new expressions, in the following manner:

$$\overline{<A,B>} = <B,\overline{A}> = <\overline{B},A>$$

$$\overline{<A,B,C>} = <\overline{A},C> + <A,\overline{B},C>$$

$$\overline{<A,B,C>} = <\overline{B},C> + <\overline{A},B,C>$$

and so on. These equations allow one to combine two equivalent terms used in logic circuit design into a single term to be applied in later calculations.

Another example to demonstrate the minimization of a logic circuit by using an I-cell is illustrated in FIG. 2, depicting a hardware design of logic circuit described by a Karnaugh map. The FIG. 2 Karnaugh map indicates the following Boolean function:

$$f(ABCDE) = \overline{ABCDE} + \overline{ABCD}E + \overline{ABC}D\overline{E} + \overline{AB}C\overline{DE} + \overline{AB}CD\overline{E} + \overline{A}BC\overline{DE} + \overline{A}B\overline{CD}E + \overline{A}BC\overline{D}E + \overline{A}BCD\overline{E} + \overline{A}BCDE + A\overline{BCDE} + A\overline{BC}D\overline{E} + A\overline{B}C\overline{DE} + A\overline{B}CD\overline{E} + AB\overline{CD}E + ABCDE$$

Figure 3:
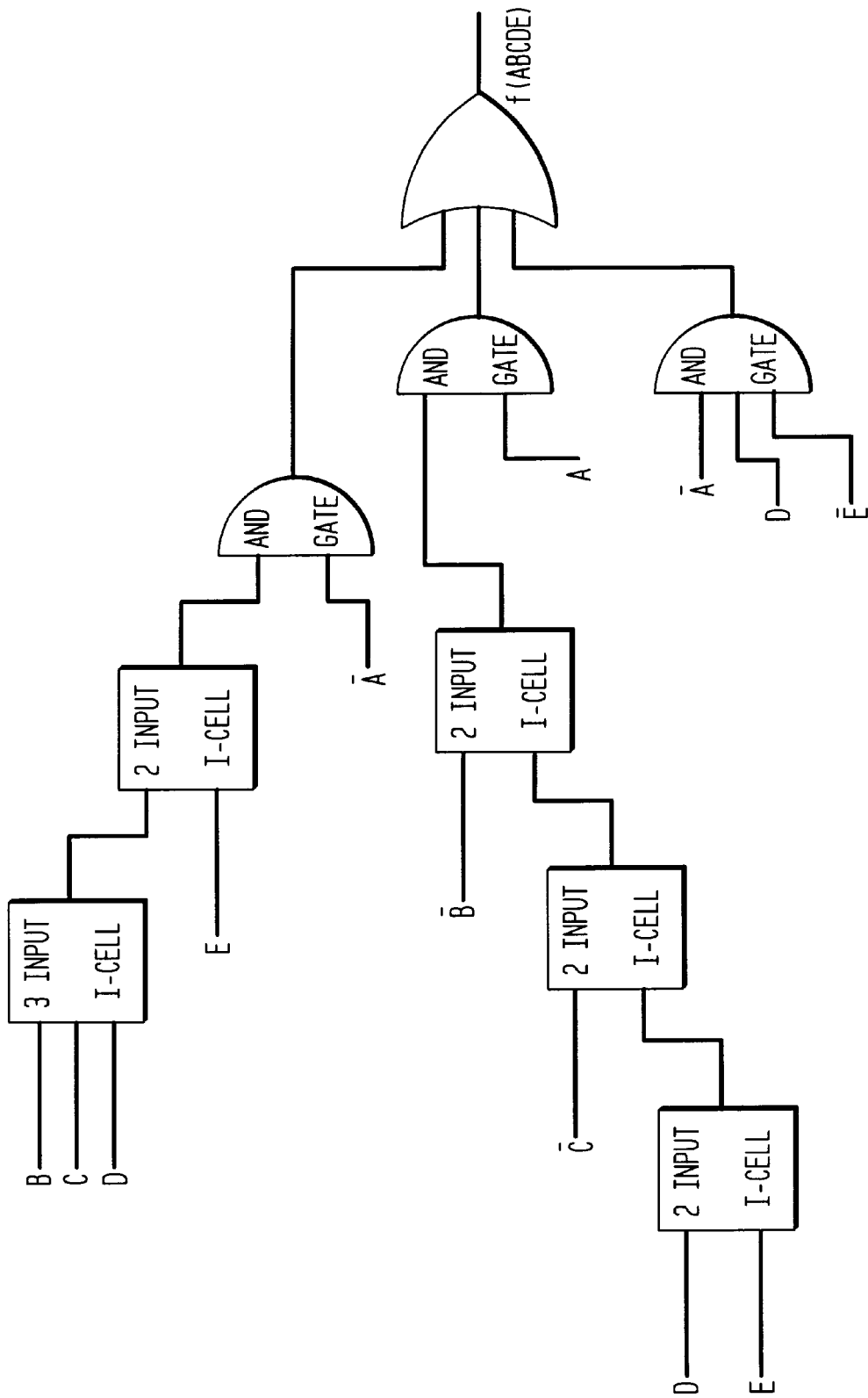
FIG. 3 depicts a minimized logic circuit after minimization using I-cells.

In order to demonstrate the logic circuit design minimization concept of the present invention, we combine product terms to an I-cell manually by partitioning the minterms into groups, shown in brackets, or "[ ]", as follows:

$$f(ABCDE) = [\overline{ABCDE} + \overline{ABCD}E + \overline{ABC}D\overline{E} + \overline{ABC}DE] +$$
$$[\overline{AB}C\overline{DE} + \overline{AB}CD\overline{E}] + [\overline{A}BC\overline{DE} + \overline{A}BCD\overline{E}] +$$
$$[\overline{A}B\overline{CD}E + \overline{A}B\overline{C}DE + \overline{A}BC\overline{D}E + \overline{A}BCDE +$$
$$AB\overline{CD}E + AB\overline{C}DE + ABC\overline{D}E + ABCDE] +$$
$$[A\overline{BCDE} + A\overline{BC}D\overline{E} + A\overline{B}C\overline{DE} + A\overline{B}CD\overline{E}]$$

$$= [\overline{ACD}E + \overline{A}C\overline{D}E] + [\overline{AE}\langle B,\overline{C},D\rangle] + [\overline{AE}\langle \overline{B},C,D\rangle] +$$
$$[\overline{ABC}\langle D,\overline{E}\rangle + \overline{ABC}\langle \overline{D},E\rangle + AB\overline{C}\langle D,\overline{E}\rangle + ABC\langle \overline{D},\overline{E}\rangle] +$$
$$[\overline{ABDE} + \overline{A}BD\overline{E}]$$

$$= \overline{AE}\langle C,D\rangle + \overline{AE}\langle B,\overline{C},D\rangle + \overline{AE}\langle \overline{B},C,D\rangle +$$
$$[A\overline{B}\langle \overline{C}, \langle D,E\rangle\rangle + AB\langle \overline{C}, \langle \overline{D},E\rangle\rangle] + \overline{A}DE$$

$$= [\overline{AE}\langle \overline{B},\overline{C},D\rangle]^1 + \overline{AE}\langle B,\overline{C},D\rangle + A\langle B, \langle \overline{C}, \langle D,E\rangle\rangle\rangle + \overline{A}DE$$

$$= \overline{A}\langle E, \langle B,\overline{C},D\rangle\rangle + A\langle B, \langle \overline{C}, \langle D,E\rangle\rangle\rangle + \overline{A}DE$$

where $\overline{AE}<\overline{C},D> + \overline{AE}<B,\overline{C},\overline{D}> = \overline{AE}<\overline{B},\overline{C},\overline{D}>$. The minimized expression consists of three I-cell terms for complete specification of the logic function. The implementation of the resultant minimized expression is shown in FIG. 3. Referring now to FIG. 3, the circuit contains 23 two input logic gates, while a three input I-cell depicted in FIG. 1 is estimated to have 5 two input gates, and a three input AND gate is estimated at 2 two input AND gates, and so forth. The solution given by the prior art minimization programs, specifically Espresso and McBoole for the Boolean function used in Example 1 are identical and the solution is given by:

$$f(ABCDE) = \overline{ABCDE} + A\overline{BCDE} + A\overline{BC}D\overline{E} + A\overline{BCDE} + BCDE + A\overline{BCDE} + \overline{AB}\overline{E} + \overline{ACE} + BC\overline{DE} + \overline{ADE} + B\overline{CDE} + \overline{B}CD\overline{E}$$

By contrast, the circuit implementation of the above solution requires 49 two input gates, which is twice as much as the FIG. 3 23 two input gate.

It is noted that in more complex cases of logic circuit design, this computation will be tedious. Therefore, a more systematic way to minimize a logic function has also been provided by the computer programs of the present invention.

The minimization of logic circuits using I-cells in accordance with the methods and computer programs of the present invention is implemented by repeated application of these four properties. Generally speaking, all possible I-cells from the given logic function are generated by combining every possible pair of logic terms, then equivalent I-cell terms are eliminated and the best subset of I-cell terms which covers all the minterms of the given logic function is provided.

The method of logic circuit minimization to reduce gates on a logic circuit provided by the present invention starts with the step of mathematically representing a selected logic circuit as a logic function f(.) having a sum of minterms by analyzing the logic circuit on a means for analyzing circuits to form a circuit description that describes the logic circuit as a group of logic terms. The logic function f(.) having a plurality of minterms and a plurality of input signal variables. In a series of defining steps, the operator defines Set-1, having a plurality of minterms, a Set-2 for all other terms generated, the plurality of input signal variables is denoted by a variable n and a dummy variable I keeps track of the operation. During an initialization step, the dummy variable's value is initialized as i=1.

During a generating step, if any of the Set-1 terms can be combined into one term by using the first property described above, a plurality of single identity cell terms are generated by first selecting pairs of terms from Set-1 having common variables and adding these pairs of terms together with a sum that forms one of the plurality of identity cell terms. Single identity cell terms are also generated by adding all remaining variables from Set-1 that are in true form in one term together with 1's complement form in another term, with a result forming another of said plurality of identity cell terms. This generating step is continued through the Set-1 terms.

In a marking step, each of said plurality of identity cell terms is marked with a symbol, such as "*", although other symbols are within the contemplation of the methods of the present invention. In a forming step, an identity cell is formed from the plurality of single identity cell terms, with said identity cell having at least two gates and at least two signal inputs. The marked plurality of identity cell terms are retained in Set-1.

In a series of transfer steps, both the identity cell and the unmarked Set-1 terms are transferred to Set-2. In a first renaming step, said Set-2 is designated as second Set-1, and Set-2 is cleared. During a series of identifying steps, a plurality of Set-2 equivalent terms having two terms of said identity cell with identical minterm representation and a plurality of Set-2 duplicate terms, having any one of said plurality of identity cells with identical minterm representation as any other of said plurality of identity cells, are identified.

During a deleting step, the plurality of Set-2 equivalent terms and the plurality of Set-2 duplicate terms are deleted from said Set-2 until no two terms logically equal to each other. At this point, most, if not all, identity cell terms have been identified and saved in Set-2, while the marked plurality of identity cell terms are still retained in Set-1. Next, the process is stopped by identifying the marked plurality of Set-1 identity cell terms having a value less than said variable n and identifying Set-1 terms where dummy variable i is also less than the variable n. In another renaming step, said Set-2 is now renamed as a second Set-1 and said Set-2 is redefined as a null set. The method of the present invention is completed by obtaining a second Set-1 result, being a plurality of logic function f identity cells, which provides a simplified plurality of gates so that the logic circuit can be designed with the fewest number of possible gates.

A number of variations of the method of the present invention are possible. To select the subset of I-cell terms from the minimization results obtained requiring the least hardware and covering all the minterms of the given logic function f(.), a Set-3 and a Set-4 can be defined. Here, all minterms of logic function f(.) are obtained and then saved into said Set-3. In a defining step, for each I-cell $I_i$ term identified, where i=1, 2, ..., that was obtained before, define a two number value $M_i$ and $N_i$, where $M_i$ is the number of operators <> in the i-th I-cell term, and $N_i$ is the number of minterms f(.) covered by the i-th I-cell term. During a series of maximization-minimization steps, the operator selects the I-cell term previously obtained with a maximum $\{N_i\}$ function and a minimum $\{M_i\}$ function. If there are two I-cell terms with the same preference, either can be selected. Then, the selected I-cell term is added to Set-4. Set-3 can be updated by deleting all the minterms covered by the selected I-cell term, either a maximum $\{N_i\}$ function or a minimum $\{M_i\}$ function. If Set-3 is not empty, the maximum $\{N_i\}$ function can be recalculated. Otherwise, the process may be stopped and the minimized I-cell terms from Set-4 are obtained. The I-cell terms in Set-4 cover all the minterms of logic function f(.) The final step requires recalculating the maximum $\{N_i\}$ function for i-th I-cell term, where i=1, 2, ..., in the remaining I-cell terms in Set-3, and then selecting the maximum $\{N_i\}$ function or a minimum $\{M_i\}$ function.

Other variations of the method of the present invention are also possible. In one variation, the logic circuit can be mathematically represented by the function f(.) as a sum of products, rather than a sum of minterms. During the final identifying steps, for those identified Set-1 terms with the value of i less than variable n, those terms may be increased by 1 and a second plurality of single identity cells may be generated utilizing the method of the present invention in order to check for further single identity cell terms. The method of the present invention can also be performed by employing a computer system.

The present invention also encompasses computer-readable medium, whose contents cause a computer system to simplify a plurality of gates on a logic circuit, as an article of manufacture, with the logic circuit being mathematically represented by a function f(.) as a sum of minterms and being analyzed on a means for analyzing a circuit to form a circuit description describing the logic circuit mathematically as a plurality of logic terms, said circuit description being inputted to the computer system, with the function f(.) having a plurality of minterms and a plurality of input signal variables. In a series of defining operations, the operator defines Set-1, having a plurality of minterms, a Set-2 for all other terms generated, the plurality of input signal variables by a variable n and a dummy variable i. During initialization, the dummy variable's value is initialized as i=1, thereafter the dummy variable keeps track of the number of times the program was run on the computer system and to terminate the program.

During a generating procedure, if any of the Set-1 terms can be combined into one term by using the first property previously described, a plurality of single identity cell terms are generated by first selecting pairs of terms from Set-1 having common variables and adding these pairs of terms together with a sum that forms one of the plurality of identity cell terms. Single identity cell terms are also generated by adding all remaining variables from Set-1 that are in true form in one term together with 1's complement form in another term, with a result forming another of said plurality of identity cell terms. This generating procedure continues through the Set-1 terms. Each of said plurality of identity cell terms is marked with a symbol, such as "*", although other symbols are within the contemplation of the article of manufacture of the present invention. An identity-cell is formed from the plurality of single identity cell terms, with said identity cell having at least two gates and at least two signal inputs. The marked plurality of identity cell terms are retained in Set-1.

In a series of transferals, both the identity cell and the unmarked Set-1 terms are transferred to Set-2. In a first renaming step, Set-2 is designated as second Set-1, and Set-2 is cleared. During a series of identifying steps, a plurality of Set-2 equivalent terms having two terms of said identity cell with identical minterm representation and a plurality of Set-2 duplicate terms, having any one of said plurality of identity cells with identical minterm representation as any other of said plurality of identity cells, are identified.

The plurality of Set-2 equivalent terms and the plurality of Set-2 duplicate terms are deleted from said Set-2 until no two terms logically equal to each other. At this point, most, if not all, identity cell terms have been identified and saved in Set-2, while the marked plurality of identity cell terms are still retained in Set-1. Next, the computer program is stopped by identifying the marked plurality of Set-1 identity cell terms having a value less than said variable n and identifying Set-1 terms where dummy variable i is also less than the variable n. In another renaming step, said Set-2 is now renamed as a second Set-1 and said Set-2 is redefined as a null set. The process is completed by obtaining a second Set-1 result, being a plurality of logic function f identity cells, which is displayed on a display means of the computer system to provide a simplified plurality of gates so that the logic circuit can be designed with the fewest number of possible gates.

Figures 4, 5:
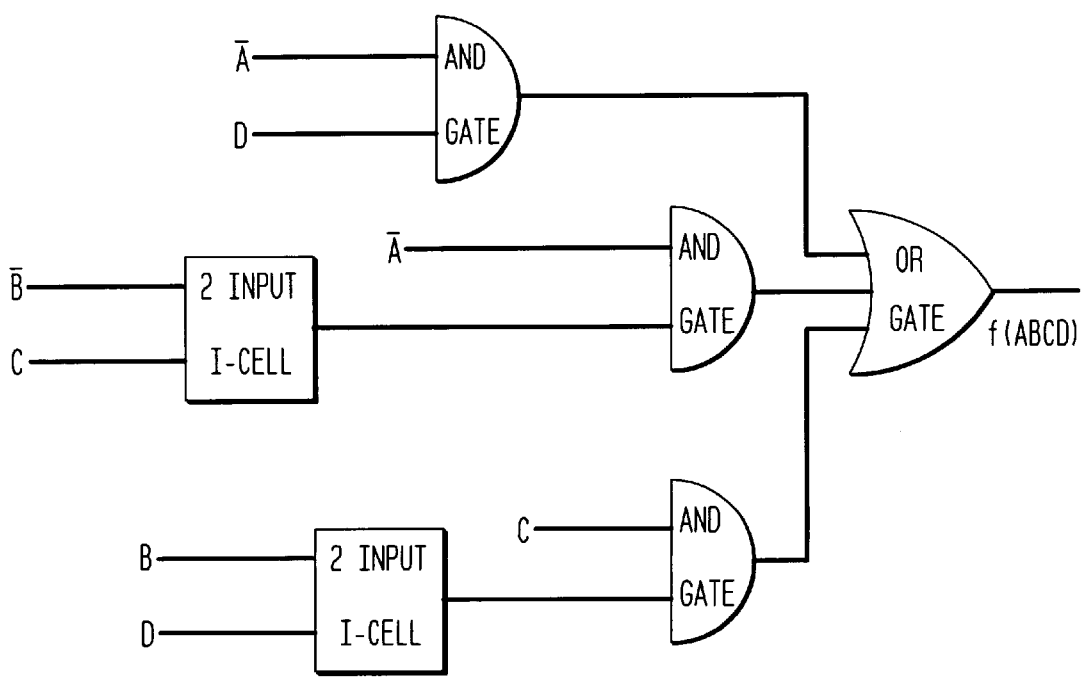
FIG. 4 is a hardware design of a logic circuit described by a Karnaugh-Map which was processed by the computer program of the present invention.
FIG. 5 depicts a minimized logic circuit using I-cells in following optimal minimization by the computer program of the present invention.

One example demonstrating the advantages and effectiveness of the computer-readable medium of the present invention is to consider the function whose Karnaugh-map is given in FIG. 4, that was processed by the computer program of the present invention. Table I presents the results of each iteration of the computer program of the present invention. Column 1 lists minterms related "1's" in the Karnaugh-Map, column 2 lists all identity cells terms generated from column 1 after the first iteration, and column 3 lists all I-cells terms generated from column 2 after the second iteration. All the equivalent I-cell terms are deleted which are not shown in the table. One can observe that no further minimization was possible after second iteration. Hence the process stops after two iterations in this example, and the final list of I-cell terms are shown in column 4 which consists of all terms in column 3 and all terms that were not marked in Table I.

The computer program utilized in the computer-readable medium of the present invention was written in the Perl software language, however, those skilled in the logic circuit design arts will readily realize that other appropriate software and firmware computer languages may be advantageously employed in accordance with this invention such as C, C ++, FORTRAN and Ada. The use of such other languages is considered to be within the scope and contemplation of this specification and the appended claims.

A number of variations of the computer-readable medium of the present invention are possible. To select the subset of I-cell terms from the minimization results obtained requiring the least hardware and covering all the minterms of the given logic function f(.), a Set-3 and a Set-4 can be defined. Here, all minterms of logic function f(.) are obtained and then saved into said Set-3. In a defining operation, for each I-cell $I_i$ term identified, where i=1, 2, . . . , that was obtained before, a two number value $M_i$ and $N_i$, is defined where $M_i$ is the number of operators <> in the i-th I-cell term, and $N_i$ is the number of minterms f(.) covered by the i-th I-cell term. During a series of maximization-minimization steps, the operator selects the I-cell term previously obtained with a maximum $\{N_i\}$ function and a minimum $\{M_i\}$ function. If there are two I-cell terms with the same preference, either can be selected. Then, the selected I-cell term is added to Set-4. Set-3 can be updated by deleting all the minterms covered by the selected I-cell term, either a maximum $\{N_i\}$ function or a minimum $\{M_i\}$ function. If Set-3 is not empty, the maximum $\{N_i\}$ function can be recalculated. Otherwise, the process may be stopped and the minimized I-cell terms from Set-4 are obtained. The I-cell terms in Set-4 cover all the minterms of logic function f(.) The final step requires recalculating the maximum $\{N_i\}$ function for i-th I-cell term, where i=1, 2, . . . , in the remaining I-cell terms in Set-3, and then selecting the maximum $\{N_i\}$ function or a minimum $\{M_i\}$ function. One example of this optimization variation of the computer program used in the computer-readable medium of the present invention, gave the following minimized I-cell terms:

$$f(ABCD)=\bar{A}D+C<B,D>+\bar{A}<\bar{B},C>$$

The hardware implementation of above logic function is shown in FIG. 5.

Other variations of the computer-readable medium of the present invention are also possible. In one variation, the logic circuit can be mathematically represented by the function f(.) as a sum of products, rather than a sum of minterms. During the final identifying steps, for those identified Set-1 terms with the value of i less than variable n, those terms may be increased by 1 and a second plurality of single identity cells may be generated utilizing the method of the present invention in order to check for further single identity cell terms.

The inventors performed minimization in accordance with the present invention on several randomly generated functions with between 5 to 10 variables compared that minimization with results obtained using Espresso, McBoole and Reed-Muller representations. These results are listed in Table II. In every case, minimization in accordance with the computer program of the present invention resulted in both a minimum number of gates and a minimal amount of silicon area for the logic circuit required to implement the functions as compared with those prior art methods.

Although the methods and articles of manufacture of the present invention have been described in relation to particular embodiments thereof, many variations, modifications and other uses will become apparent to those skilled in the art. Therefore, the present invention should not be limited by the specific disclosure herein, but rather only by the appended claims.

TABLE I

| Function | After 1st Iteration | After 2nd Iteration | Final set of p-terms |
|---|---|---|---|
| $\bar{A}\bar{B}\bar{C}D$ * | $\bar{A}B<\bar{C},D>$ * | $\bar{A}<\bar{B}<\bar{C},D>>$ * | $B<\bar{A},\bar{C},D>$ |
| $\bar{A}\bar{B}C\bar{D}$* | $\bar{A}BD$ * | $\bar{A}D$ | $D<\bar{A},\bar{B},\bar{C}>$ |
| $\bar{A}\bar{B}CD$ * | $\bar{A}C<\bar{B},D>$ * | $<\bar{A}\bar{C}<\bar{B},D>>$ | $\bar{A}<\bar{B},C,\bar{D}>$ |
| $\bar{A}B\bar{C}\bar{D}$* | $\bar{A}\bar{C}D$ * | $\bar{A}<\bar{B},C>$ | $C<\bar{A},\bar{B},D>$ |
| $\bar{A}B\bar{C}D$ * | $\bar{A}D<B,C>$ | $C<\bar{B},\bar{D}>$ | $\bar{A}<\bar{B},C,D>$ |
| $\bar{A}BCD$ * | $B<\bar{A},\bar{C},D>$ | | $BC<\bar{A},D>$ |
| $A\bar{B}\bar{C}\bar{D}$* | $D<\bar{A},\bar{B},\bar{C}>$ | | $CD<\bar{A},\bar{B}>$ |
| $ABCD$ * | $\bar{A}B\bar{C}$ * | | $\bar{D}<\bar{A},B,\bar{C}>$ |
| | $\bar{A}D<\bar{B},C>$ * | | $B<\bar{A},\bar{C},\bar{D}>$ |
| | $\bar{A}<B,C,\bar{D}>$ | | $<\bar{A},B,\bar{C},D>$ |
| | $\bar{A}\bar{C}<B,D>$ * | | $BD<\bar{A},\bar{C}>$ |
| | $B\bar{C}\bar{D}$* | | $C<\bar{A},B,D>$ |
| | $C<\bar{A},\bar{B},\bar{D}>$ | | $\bar{A}<\bar{B}<\bar{C},D>>$ |
| | $\bar{A}<\bar{B},C,D>$ | | $\bar{A}D$ |
| | $\bar{A}D<\bar{B},C>$ * | | $<\bar{A}\bar{C}<\bar{B},D>>$ |
| | $\bar{A}CD$ * | | $\bar{A}<\bar{B},C>$ |
| | $BC<\bar{A},D>$ | | $C<\bar{B},\bar{D}>$ |
| | $CD<\bar{A},\bar{B}>$ | | |
| | $\bar{A}B\bar{C}$* | | |
| | $\bar{A}B<\bar{C},\bar{D}>$ * | | |
| | $\bar{D}<\bar{A},B,\bar{C}>$ | | |
| | $B<\bar{A},\bar{C},\bar{D}>$ | | |
| | $\bar{A}BD$ * | | |
| | $<\bar{A},B,\bar{C},D>$ | | |
| | $BD<\bar{A},\bar{C}>$ | | |
| | $C<\bar{A},B,D>$ | | |
| | $BCD$ * | | |
| | $AC<B,D>$ | | |

"*" indicates it is combined with other term

TABLE II

| Function (Minterms list) | # gates by the Invention | #gates by Espresso | # gates by McBoole | # gate by Reed-Muller |
|---|---|---|---|---|
| 1, 2, 3, 7, 8, 11, 13, 14, 16, 18, 19, 21, 24, 27, 29, 30, 31 | 26 | 37 | 37 | 55 |
| 8, 11, 13, 14, 24, 27, 29, 30 | 7 | 15 | 15 | 9 |
| 1, 2, 3, 7, 8, 11, 13, 14, 16, 18, 19, 29 | 26 | 32 | 32 | 59 |

What we claim is:

1. A method to simplify a plurality of gates on a logic circuit, comprising the steps of:

examining said logic circuit on a means for analyzing a circuit to form a circuit description describing said logic circuit mathematically as a plurality of logic terms, said logic circuit being mathematically represented by a function f(.) as a sum of minterms, wherein the function f(.) of said logic circuit having a plurality of minterms and a plurality of input signal variables;

defining a Set-1 of said plurality of minterms;

defining all terms generated as a Set-2;

defining said plurality of input signal variables by a variable n;

defining a dummy variable i;

initializing the value of said dummy variable i as i=1;

generating a plurality of single identity cell terms by first selecting pairs of terms from said Set-1 having common variables and adding said pairs of terms together witb a sum forming one of said plurality of identity cell terms;

adding all remaining variables from said Set-1 in true form in one term together with 1's complement form in another term with a result forming another one of said plurality of identity cell terms;

marking each of said plurality of identity cell terms with a symbol;

forming an identity-cell from said plurality of single identity cell terms, said identity-cell having at least two gates and at least two signal inputs;

retaining said marked plurality of identity cell terms in said Set-1;

transferring said identity-cell to said Set-2;

transferring said plurality of unmarked Set-1 terms to said Set-2;

identifying a plurality of equivalent terms in said Set-2 having two terms of said identity cell with identical minterm representation;

identifying a plurality of duplicate terms in said Set-2 having any one of said plurality of identity cell terms with identical minterm representation as any other of said plurality of identity cell terms;

deleting said plurality of equivalent terms and said plurality of duplicate terms from said Set-2;

identifying said marked plurality of identity cell terms in Set-1 with a value less than said variable n;

identifying Set-1 terms where said i is a value less than said variable n;

renaming said Set-2 as a second Set-1;

redefining said Set-2 as a null set;

obtaining a second Set-1 result, said second Set-1 result being a plurality of logic function f identity cells;

representing a simplified plurality of gates for said logic circuit based on said plurality of logic function f identity cells; and configuring said logic circuit to operate with said simplified plurality of gates.

2. The method to simplify a plurality of gates on a logic circuit, as recited in claim 1, further comprising the steps of:

defining a Set-3;

defining a Set-4;

obtaining a plurality of minterms having said function f(.); and saving said plurality of minterms in a saved Set-3.

3. The method to simplify a plurality of gates on a logic circuit, as recited in claim 2, further comprising the steps of:

said plurality of identity cell terms having an $I_i$ term where i=1, 2, . . . and so on;

defining a two number function $M_i$ from said $I_i$ term; and defining a two number function $N_i$ from said $I_i$ term.

4. The method to simplify a plurality of gates on a logic circuit, as recited in claim 3, wherein:

said $M_i$ function having a plurality of operator functions <> in an i th one of said plurality of identity cell terms; and said $N_i$ function having a plurality of said minterms f(.) covered by said i th identity cell term.

5. The method to simplify a plurality of gates on a logic circuit, as recited in claim 4, further comprising the steps of:

selecting a maximum $\{N_i\}$ function from a minimum portion of said plurality of identity cell terms;

selecting a minimum $\{M_i>\}$ function from said minimum portion of said plurality of identity cell terms;

forming a preference term by determining if said maximum $\{N_i\}$ function and said minimum $\{M_i\}$ function have an identical preference term; and adding said preference term to said Set-4.

6. The method to simplify a plurality of gates on a logic circuit, as recited in claim 5, further comprising the step of updating said Set-3 by deleting a plurality of minterms equivalent to said preference term.

7. The method to simplify a plurality of gates on a logic circuit, as recited in claim 6, further comprising the step of obtaining a plurality of minimized identity cell terms from said Set-4.

8. The method to simplify a plurality of gates on a logic circuit, as recited in claim 7, further comprising the step of recalculating said maximum $\{N_i\}$ function.

9. The method to simplify a plurality of gates on a logic circuit, as recited in claim 1, wherein said logic circuit is mathematically represented by said function f(.) as a sum of products.

10. The method to simplify a plurality of gates on a logic circuit, as recited in claim 1, further comprising:

increasing said identified Set-1 terms with said i having a value less than said variable n, by 1; and generating a second plurality of single identity cell terms.

11. The method to simplify a plurality of gates on a logic circuit, as recited in claim 8, wherein each of said plurality of identity cell terms is marked with the symbol "*".

12. The method to simplify a plurality of gates on a logic circuit, as recited in claim 11, wherein a computer system is employed.

13. A computer-readable medium whose contents cause a computer system to simplify a plurality of gates on a logic circuit, said logic circuit being mathematically represented by a function f(.) as a sum of minterms, said logic circuit being analyzed on a means for analyzing a circuit to form a circuit description describing said logic circuit mathematically as a plurality of logic terms, said circuit description being inputted to said computer system, comprising:

the function f(.) of said logic circuit having a plurality of minterms and a plurality of input signal variables;

defining a Set-1 of said plurality of minterms;

defining all terms generated by said computer system as a Set-2;

defining said plurality of input signal variables by a variable n;

defining a dummy variable i to keep track of the number of times the said computer-readable medium was run on the computer system and to terminate the execution of said computer-readable medium;

initializing the value of said dummy variable i as i=1;

generating a plurality of single identity cell terms by first selecting pairs of terms from said Set-1 having common variables and adding said pairs of terms together with a sum forming one of said plurality of identity cell terms;

adding all remaining variables from said Set-1 in true form in one term together with 1's complement form in another term with a result forming another one of said plurality of identity cell terms;

marking each of said plurality of identity cell terms with a symbol;

forming an identity-cell from said plurality of single identity cell terms, said identity-cell having at least two gates and at least two signal inputs;

retaining said marked plurality of identity cell terms in said Set-1;

transferring said identity-cell to said Set-2;

transferring said plurality of unmarked Set-1 terms to said Set-2;

identifying a plurality of equivalent terms in said Set-2 having two terms of said identity-cell with identical minterm representation;

identifying a plurality of duplicate terms in said Set-2 having any one of said plurality of identity cell terms with identical minterm representation as any other of said plurality of identity cell terms;

deleting said plurality of equivalent terms and said plurality of duplicate terms from said Set-2;

identifying said marked plurality of identity cell terms in Set-1 with a value less than said variable n;

identifying Set-1 terms where said i is a value less than said variable n;

renaming said Set-2 as a second Set-1;

redefining said Set-2 as a null set;

obtaining a second Set-1 result, said second Set-1 result being a plurality of logic function f identity cells, said plurality of logic function f identity cells providing a simplified plurality of gates for said logic circuit;

representing said simplified plurality of gates based on said plurality of logic function f identity cells; and configuring said logic circuit to operate with said simplified plurality of gates.

14. The computer-readable medium, as recited in claim 13, further comprising:

defining a Set-3;

defining a Set-4;

obtaining a plurality of minterms having said function f(.); and saving said plurality of minterms in a saved Set-3.

15. The computer-readable medium, as recited in claim 14, further comprising:

said plurality of identity cell terms having an $I_i$ term where i=1, 2, . . . ; and so on;

defining a two number function $M_i$ from said $I_i$ term; and defining a two number function $N_i$ from said $I_i$ term.

16. The computer-readable medium, as recited in claim 15, wherein:

said $M_i$ function having a plurality of operator functions <> in an i th one of said plurality of identity cell terms; and said $N_i$ function having a plurality of said minterms f (.) covered by said i th identity cell term.

17. The computer-readable medium, as recited in claim 16, further comprising:

selecting a maximum $\{N_i\}$ function from a minimum portion of said plurality of identity cell terms;

selecting a minimum $\{M_i\}$ function from said minimum portion of said plurality of identity cell terms;

forming a preference term by determining if said maximum $\{N_i\}$ function and said minimum $\{M_i\}$ function have an identical preference term; and adding said preference term to said Set-4.

18. The computer-readable medium, as recited in claim 17, further comprising updating said Set-3 by deleting a plurality of minterms equivalent to said preference term.

19. The computer-readable medium, as recited in claim 18, further comprising obtaining a plurality of minimized identity cell terms from said Set-4.

20. The computer-readable medium, as recited in claim 19, further comprising recalculating said maximum $\{N_i\}$ function.

21. The computer-readable medium, as recited in claim 13, wherein said logic circuit is mathematically represented by said function f(.) as a sum of products.

22. The computer-readable medium, as recited in claim 13, further comprising:

increasing said identified Set-1 terms with said i having a value less than said variable n, by 1; and generating a second plurality of single identity cell terms.

23. The computer-readable medium, as recited in claim 13, wherein each of said plurality of identity cell terms is marked with the symbol "*".

24. The computer-readable medium, as recited in claim 20, wherein:

a computer program in said computer system of the present invention is written in the Perl software languages; and said computer system employs a display means.

* * * * *

UNITED STATES PATENT AND TRADEMARK OFFICE
CERTIFICATE OF CORRECTION

| | | |
|---|---|---|
| PATENT NO. | : 5,974,242 | Page 1 of 1 |
| APPLICATION NO. | : 08/937960 | |
| DATED | : October 26, 1999 | |
| INVENTOR(S) | : T. Raju Damarla and Wei Su | |

It is certified that error appears in the above-identified patent and that said Letters Patent is hereby corrected as shown below:

IN THE SPECIFICATION:

Column 1, line 63 correct

"$A fheight\overline{BCDE}$" to read -- $\overline{ABCDE}$ --;

IN THE CLAIMS:

Column 11, line 66, Claim 5, correct "$\{M_i > \}$" to read -- $\{M_i\}$ --.

Signed and Sealed this

Seventeenth Day of July, 2007

JON W. DUDAS
*Director of the United States Patent and Trademark Office*